United States Patent [19]
Skelton et al.

[11] Patent Number: 6,147,478
[45] Date of Patent: Nov. 14, 2000

[54] HYSTERETIC REGULATOR AND CONTROL METHOD HAVING SWITCHING FREQUENCY INDEPENDENT FROM OUTPUT FILTER

[75] Inventors: Dale James Skelton; Rais Karimovich Miftakhutdinov, both of Plano, Tex.

[73] Assignee: Texas Instruments Incorporated, Dallas, Tex.

[21] Appl. No.: 09/399,302

[22] Filed: Sep. 17, 1999

[51] Int. Cl.[7] ................................. G05F 1/40; G05F 1/44
[52] U.S. Cl. ........................................... 323/288; 323/284
[58] Field of Search .................................... 323/283, 284, 323/280, 285, 288

[56] References Cited

U.S. PATENT DOCUMENTS

| | | | |
|---|---|---|---|
| 3,660,753 | 5/1972 | Judd et al. | 323/22 T |
| 4,456,872 | 6/1984 | Froeschle | 323/286 |
| 5,345,165 | 9/1994 | Froeschle | 323/284 |
| 5,399,958 | 3/1995 | Iyoda | 323/282 |
| 5,548,206 | 8/1996 | Soo | 323/284 |
| 5,587,650 | 12/1996 | Massie | 323/282 |
| 5,623,198 | 4/1997 | Massie et al. | 323/282 |
| 5,680,034 | 10/1997 | Redl | 323/235 |
| 5,770,940 | 6/1998 | Goder | 323/282 |
| 5,818,207 | 10/1998 | Hwang | 323/288 |
| 5,894,243 | 4/1999 | Hwang | 323/242 |
| 5,994,882 | 11/1999 | Ma | 323/222 |

OTHER PUBLICATIONS

"A Fast, Efficient Synchronous–Buck Controller for Microprocessor Power Supplies," Proceedings from High Frequency Power Conversion Conference, Santa Clara, CA, Nov. 7–13, 1998, pp. 182–198 (Dave Briggs, Robert Martinez, Rais Miftakhhutdinov, Dale Skelton).

*Primary Examiner*—Peter S. Wong
*Assistant Examiner*—Bao Q. Vu
*Attorney, Agent, or Firm*—Mark E. Courtney; W. James Brady, III; Frederick J. Telecky, Jr.

[57] ABSTRACT

A DC to DC power converter (58) and method of controlling the DC to DC power converter (58). The converter (58) has a first switch ($S_1$) coupled to a second switch ($S_2$). The converter (58) is adapted to receive an input voltage $V_{in}$, generate an output voltage $V_{out}$, and operate at a switching frequency. A hysteretic mode control circuit (52) includes a first circuit generating a ramp signal at input (56) for controlling the converter (58). The first circuit includes a first capacitor ($C_1$) with the ramp signal generated at an end of the first capacitor ($C_1$). The hysteretic mode control circuit (52) is coupled to the first ($S_1$) and second ($S_2$) switches, where the switching frequency of the first and second switches is dependent upon the ramp signal (56) determined by the value of the components of the first circuit rather than on the voltage from the output filter of the DC to DC power converter. The invention is particularly useful for applications such as DSPs and mixed signal or analog circuits.

22 Claims, 4 Drawing Sheets

HYSTERETIC REGULATOR AND CONTROL METHOD HAVING SWITCHING FREQUENCY INDEPENDENT FROM OUTPUT FILTER

TECHNICAL FIELD OF THE INVENTION

This invention relates generally to integrated circuits, and more specifically to a hysteretic mode control regulator for a switching DC to DC converter.

BACKGROUND OF THE INVENTION

As logic integrated circuits (ICs) have migrated to lower working voltages in the search for lower power consumption and higher operating frequencies, and as overall system sizes have continued to decrease, IC power supply designs with smaller size and higher efficiency are in demand. Switch mode power supplies, or DC to DC converters, as they are sometimes called, are frequently used to supply IC circuits such as digital signal processors (DSPs) and mixed signal analog circuits, etc., to efficiently convert an input supply voltage to voltage levels appropriate for internal circuitry as well as external circuitry that the IC is coupled to. For instance, a 5.0 volt supply voltage provided to a BiCMOS IC may need to be decreased internally to 2.8 volts to operate internal CMOS circuitry. As appliances and circuit designs continue to decrease in size, the need for smaller and more efficient IC switch mode power converters increases.

DC to DC converters, as part of the regulated power supplies, are commonly used to provide low ripple and tolerance supplying voltages to electronic systems. Most electronic systems for computer, communication and industrial applications typically include integrated circuits like microprocessors, digital signal processors, memory, for example, which tend to cause high slew rate transients in the entire electronic system. A trend exists in the industry towards lower supply voltages for electronic systems, while the required current from power supply systems is increasing. Optimal control approaches on DC to DC converters are very important to meet tight static and dynamic tolerance requirements while supplying voltages at minimum costs.

SUMMARY OF THE INVENTION

The present invention achieves technical advantages as a fast transient response hysteretic DC to DC converter having a switching frequency independent from the output filter. In one embodiment, disclosed is a DC to DC power converter having a hysteretic mode control circuit, the converter having a first switch coupled to a second switch and adapted to receive an input voltage, generate an output voltage, and operate at a switching frequency. The control circuit includes a first circuit generating a ramp signal for controlling the converter, with the first circuit having a first capacitor generating the ramp signal at one end. The control circuit includes a hysteretic mode control circuit coupled to the first and second switches. The first circuit is coupled to an input of the hysteretic mode control circuit. The switching frequency of the power converter is dependent on the ramp signal of the first circuit rather than on the output filter of the power converter such as the output voltage.

In another embodiment, disclosed is a DC to DC power converter having a first switch coupled to a second switch operating at a switching frequency, and adapted to receive an input voltage, generate an output voltage. An output filter coupled to the output voltage, wherein the output voltage has a ripple. The power converter includes a first circuit generating a ramp signal being greater than the output voltage ripple. The first circuit comprises a first capacitor, with the ramp signal generated at an end of the first capacitor. The power converter includes a hysteretic mode control circuit coupled to the first and second switches and controlling the switching frequency of the first and second switches as a function of the ramp signal determined by the components of the first circuit rather than the output voltage of the output filter, wherein the ripple of the output voltage is reduced.

Also disclosed is a method of controlling the output voltage of a DC to DC power converter having a first switch coupled to a second switch operating at a switching frequency. The converter is adapted to receive an input voltage and generate an output voltage. The method includes the steps of generating a ramp signal using a first capacitor coupled to an input of a hysteretic mode control circuit. The method includes the step of using the ramp signal to control the switching frequency, which is dependent on the value of the first capacitor.

The present invention is advantageous in providing an efficient hysteretic mode control circuit for a DC to DC converter having excellent load current transient response characteristics. Unlike prior art circuits, the switching frequency of the DC to DC converter is independent from the output filter characteristics. Furthermore, a lower tolerance range is achieved with the present invention, and the voltage output ripple is lower than in prior art circuits. A further advantage is decreased size and lowered cost of the output and input filters due to the use of high frequency, low value capacitors for components of the present circuit. The additional circuit components disclosed herein may be implemented in monolithic integrated circuitry, thus decreasing the number of components, overall circuit size, and total costs. Also, external synchronization of multiple DC to DC converters can be easily implemented in accordance with an embodiment of the present invention.

BRIEF DESCRIPTION OF THE DRAWINGS

In the drawings, which form an integral part of the specification and are to be read in conjunction therewith.

Like numerals and symbols are employed in different figures to designate similar components in various views unless otherwise indicated.

DETAILED DESCRIPTION OF PREFERRED EMBODIMENTS

Three prior art DC-to-DC converters having voltage mode control circuits will first be discussed, followed by a description of several preferred embodiments of the present invention.

Figure 1:
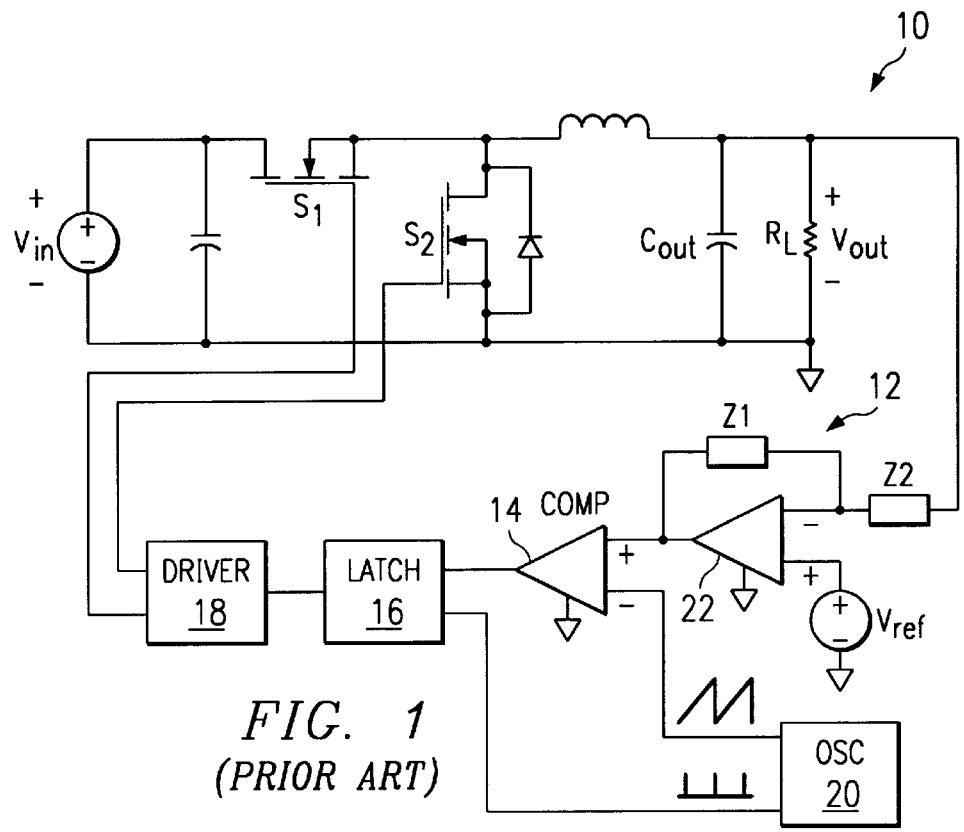
FIG. 1 illustrates a prior art DC-to-DC convert having a pulse width modulated (PWM) voltage mode control circuit.

A conventional PWM voltage mode control DC to DC converter 10 of the prior art is shown in FIG. 1. In this mode of control, the error amplifier 12 output signal comprises the gained difference between the converter output voltage $V_{out}$ and reference voltage $V_{ref}$. The output signal of the error amplifier 12 is compared by comparator 14 with a constant frequency ramp waveform generated by oscillator 20. As a result, the fixed frequency PWM output signal from the comparator 14 controls the on and off time of the power switches $S_1$ and $S_2$, keeping the output voltage $V_{out}$ constant and independent from the load current and input voltage $V_{in}$ variations. This prior art voltage mode control configuration has several disadvantages. A careful feedback loop design is required, and the error amplifier usually has three poles, including a zero frequency pole and two zeroes $Z_1$ and $Z_2$ to stabilize the converter at all conditions. Moreover, the feedback loop has a narrow frequency bandwidth, and this approach results in poor load current transient characteristics.

Figure 2:
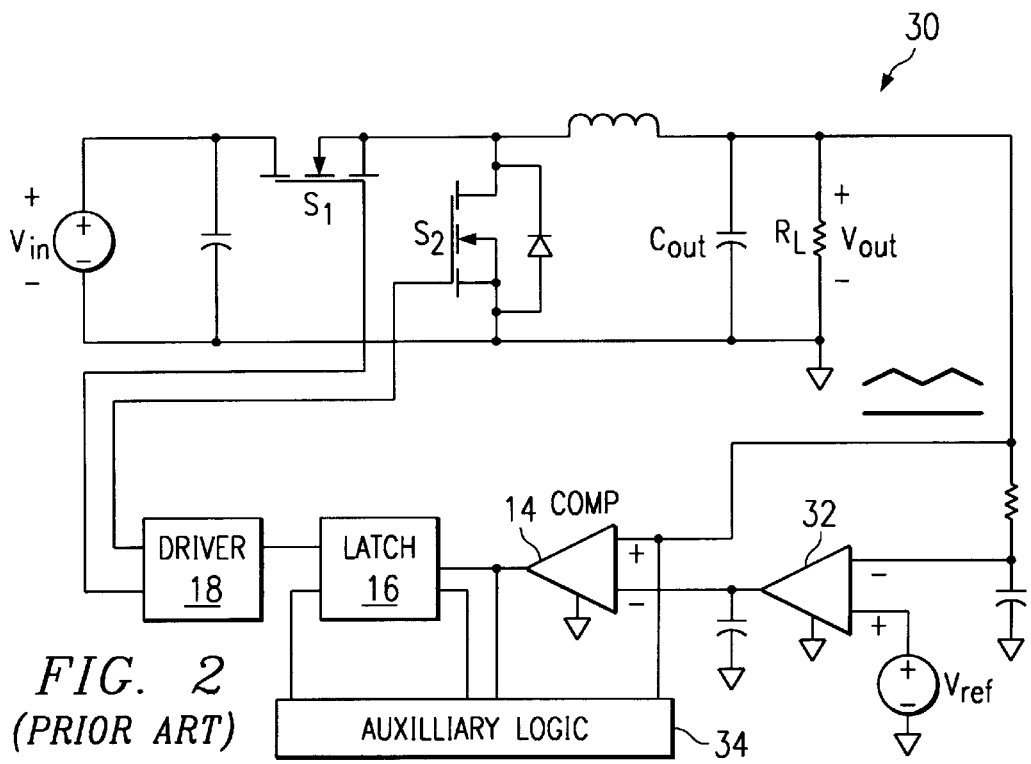
FIG. 2 illustrates a prior art DC-to-DC convert having a $V^2$ mode control circuit.

A DC to DC converter 30 having a $V^2$ mode control circuit is shown in FIG. 2 and is described in U.S. Pat. No. 5,770,940 issued in June of 1998 to Goder. The control circuitry provides improved load current transient characteristics compared to the prior art circuit of FIG. 1. The voltage ripple signal $V_{out}$ from the converter output is compared with the output of the error amplifier 32 by comparator 14. The feedback loop includes a slow path, the error amplifier 32 with associated compensation circuitry, and a fast path, the comparator 14 input connected directly to the output voltage $V_{out}$ of converter. During load current transients, the comparator 14 reacts immediately to the output voltage $V_{out}$ changes. This control approach improves dynamic characteristics but has several drawbacks. First, the switching frequency and stability of the system greatly depends upon the output filter characteristics, including Equivalent Series Resistance (ESR) and Equivalent Series Inductance (ESL) of the output capacitor $C_{out}$ and stray inductance and resistance of the supply paths. As a result, the same schematic might have different behavior in designs with a different layout. Second, it is assumed that ESR is dominant in the output ripple waveform, so the output ripple has almost linear ramp waveform. Large, expensive and unreliable electrolytic capacitors are required, to meet this assumption. When small high frequency ceramic or film capacitors are used in this circuit, the output voltage ripple has a waveform approximately equal to a square function of time and has a π/2 phase shift relative to the output current ripple, which may cause unstable and unpredictable operation. Third, this approach requires auxiliary logic circuitry 34 to avoid overstressing power switches $S_1$ and $S_2$ by restricting maximum on and off times during start up and other transients conditions of the circuit.

Figure 3:
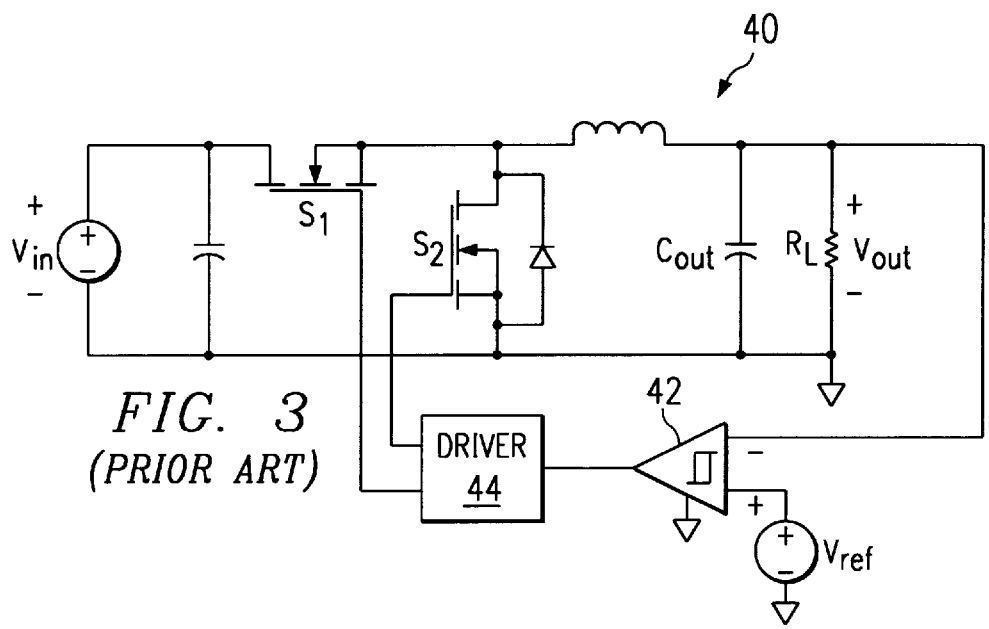
FIG. 3 shows another prior art DC-to-DC convert having a hysteretic mode control circuit.

Another prior art control approach for a DC to DC converter is a hysteretic mode control circuit as shown in FIG. 3. This configuration is also referred to in the art as a ripple regulator or bang-bang regulator. Such a hysteretic mode control has faster transient response characteristics than other control circuits because the control circuitry reacts on the load transient in the same switching cycle. The response time depends only on hysteretic comparator 42 and driver 44 circuitry delays. However, a problem with this control approach is that the switching frequency of the converter is dependent upon the output filter characteristics of $C_{out}$. Another drawback is that delays during high frequency operation cause the output voltage ripple to exceed the hysteresis window. This results in the output voltage ripple becoming too high.

Figure 4:
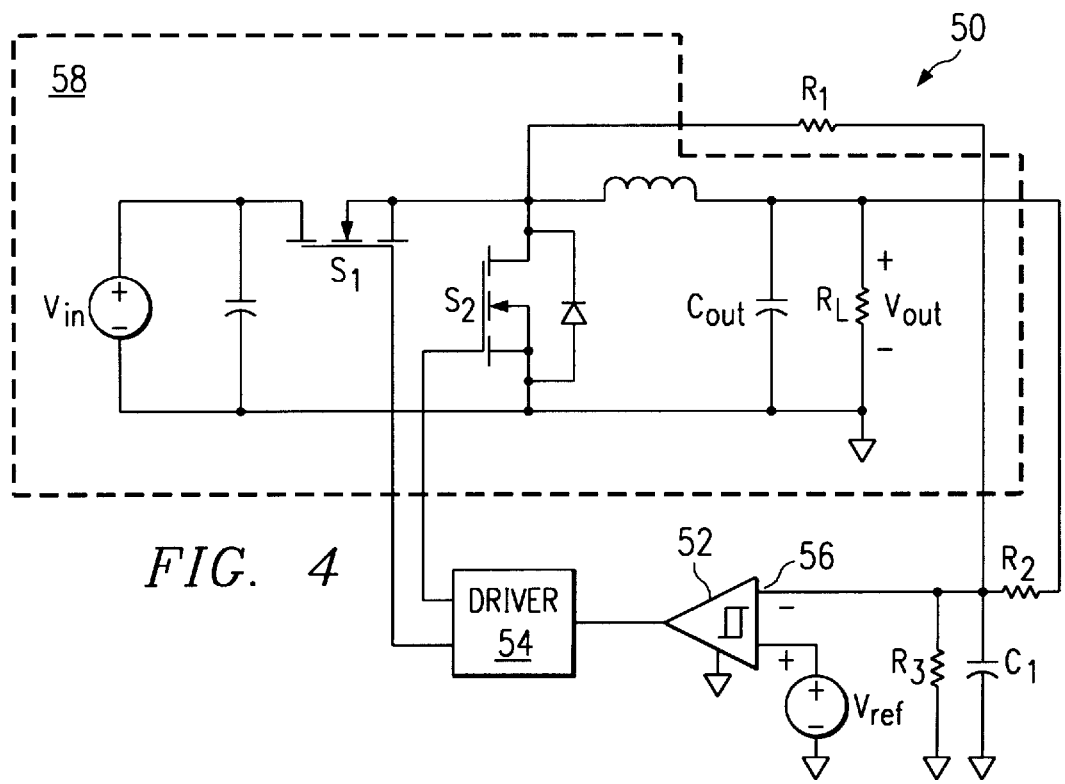
FIG. 4 illustrates a schematic diagram of a first embodiment of the present invention with a first feedback resistor $R_1$ and a first capacitor $C_1$ that generate an additional ramp signal through the input of the hysteretic comparator 52.

The present invention solves the above problems in the prior art. FIG. 4 shows a schematic diagram of a first embodiment generally shown at 50, including a DC to DC converter 58 with a capacitor $C_1$ coupled between an input 56 of a hysteretic comparator 52 and ground. A feedback resistor $R_1$ is connected between the input of hysteresis comparator 52 and a node between power switches $S_1$ and $S_2$ of the DC to DC converter 58. The $R_1/C_1$ feedback circuitry generates a time constant and generates an additional ramp signal at the input 56 of the hysteretic comparator 52. Two signals are summed by the comparator 52 through the input 56: one being the ramp signal generated by the $R_1/C_1$ circuitry, and the other being the signal $V_{out}$ generated by the output of converter 58. The additional ramp signal applied in the first embodiment 50 to the hysteretic comparator 52 input 56 is achieved by adding resistor $R_1$, which is connected between the input 56 of the comparator 52 and a node between the power switches $S_1$ and $S_2$, in combination with additional capacitor $C_1$ connected between the input 56 of the comparator 52 and ground. Resistor $R_2$ is coupled between the input 56 of the comparator 52 and the node at $V_{out}$, and resistor $R_3$ is coupled between the input 56 and ground.

By proper selection of the values of $R_1$ and $C_1$, an amplitude of the additional ramp signal may be obtained that is greater than the output ripple at $V_{out}$ of the converter 58. As the result, the switching frequency of the switches $S_1$ and $S_2$ of the converter 58 is increased, while the output ripple is lowered. The switching frequency of the converter 58 now depends on the values of resistor $R_1$ and capacitor $C_1$ of the control circuitry, rather than depending on the output filter characteristics including the ESR, ESL and capacitance C of the output capacitor $C_{out}$, as in the prior art. Furthermore, the DC feedback signal established by $R_1$ from the output of the converter controls the DC level of the output voltage $V_{out}$. Because the switching frequency does not depend on the output capacitor $C_{out}$ characteristics, high frequency, low cost ceramic or film capacitors may be used in the DC to DC converter while having excellent load current transient response characteristics. The switching frequency for the first embodiment may be evaluated by the following equation:

$$\text{Equation 1:} \quad Fs \cong \frac{(V_{in} - V_{ref}) * V_{ref}}{V_{in} * R_1 * C_1 * \text{Hyst}}$$

where "Hyst" is the hysteresis window of the hysteretic comparator 52. The output voltage may be evaluated by the following equation:

$$\text{Equation 2:} \quad V_{out} = V_{ref} * \left(1 + \frac{R_1 * R_2}{R_3 * (R_1 + R_2)}\right)$$

Figure 5:
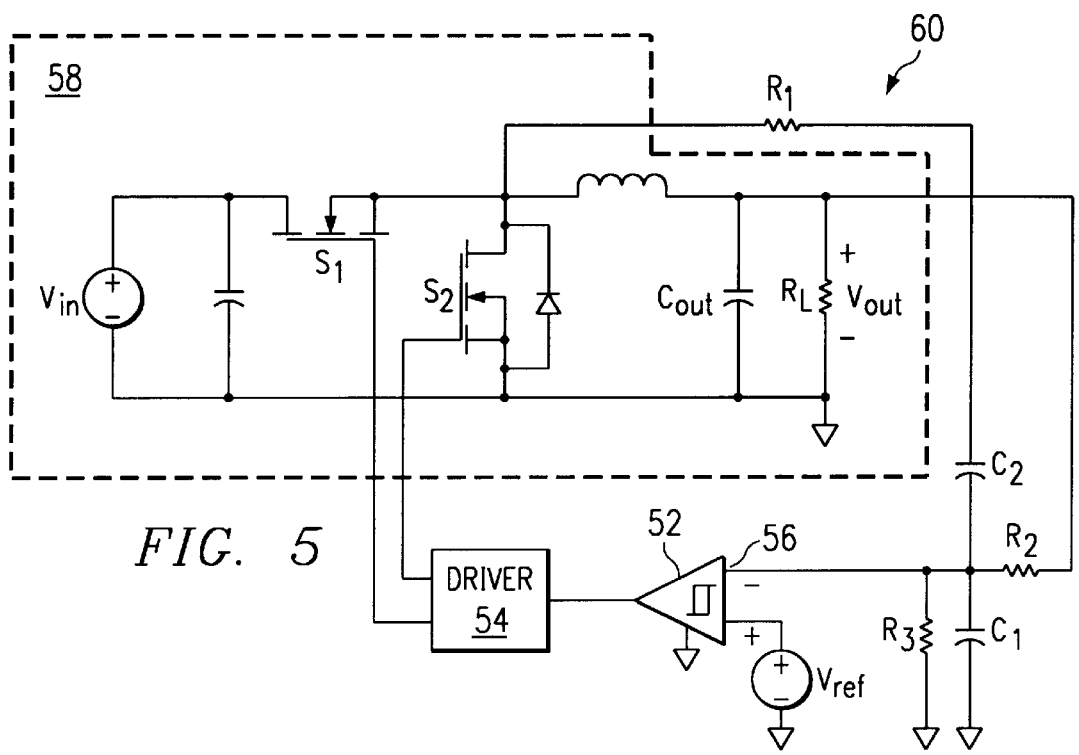
FIG. 5 illustrates a schematic diagram of a second embodiment of the present invention having hysteretic comparator 52 with a decoupling capacitor $C_2$ in series with feedback resistor $R_1$ to prevent dependence of the output voltage from the $R_1$ value.

A second embodiment generally shown at 60 of the present invention including the DC to DC converter 58 is shown in FIG. 5. As in the first embodiment, a capacitor $C_1$ is coupled between the input to hysteretic comparator 52 and ground, and a feedback resistor $R_1$ is connected between the input of hysteresis comparator 52 and the node between power switches $S_1$ and $S_2$ of the DC to DC converter 58. The $R_1/C_1$ circuitry forms and generates an additional ramp signal at the input 56 of the hysteretic comparator 52. In addition, a decoupling capacitor $C_2$ is coupled in series with $R_1$. The value of $C_2$ is preferably much higher than $C_1$, for example, 10 times the value of $C_1$. The decoupling capacitor $C_2$ prevents the output voltage $V_{out}$ from significantly depending on the value of resistor $R_1$, a feature which may be desirable in some circuit designs. The switching frequency for the second embodiment may be evaluated by the following equation:

$$\text{Equation 3:} \quad Fs \cong \frac{(V_{in} - V_{out}) * V_{out}}{V_{in} * R_1 * C_1 * \text{Hyst}}$$

The output voltage may be evaluated by the following equation:

Equation 4: $V_{out} = V_{ref} * (1 + R_2/R_3)$

Both the first and second embodiments 50 and 60 improve the input voltage transient response and line regulation of the output voltage $V_{out}$, because the slope of the ramp signal generated by $R_1/C_1$ at 56 depends on the input voltage $V_{in}$ and gives a feed-forward effect to the control circuitry. Although the line transient response and line regulation of $V_{out}$ are improved, the switching frequency of the converter 58 remains dependent from the input voltage $V_{in}$ due to the additional ramp signal generated by $R_1/C_1$.

Figure 6:
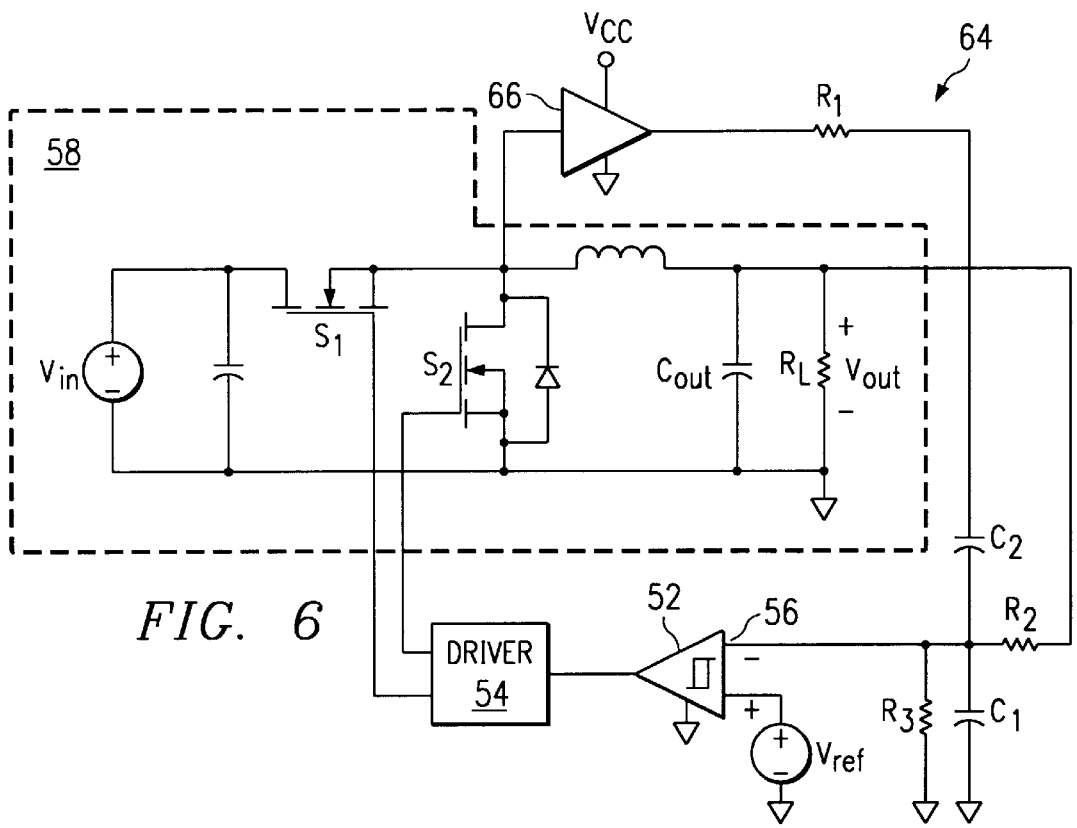
FIG. 6 is a schematic diagram of a third embodiment of the present invention with $R_1$ coupled to buffer 66.

In a third embodiment shown generally at 64, resistor $R_1$ is connected to the output of a buffer circuit 66, as shown in FIG. 6. The input of the buffer circuit 66 is connected to the node common to transistors $S_1$ and $S_2$. The amplitude of the output pulses from the buffer 66 is constant and independent of $V_{in}$. Thus, the operating frequency of the converter is independent from $V_{in}$. The equation describing the operating frequency for this embodiment is:

$$\text{Equation 5:} \quad Fs \cong \frac{(V_{cc} - V_{out}) * V_{out}}{V_{cc} * R_1 * C_1 * \text{Hyst}}$$

where $V_{cc}$ is the peak amplitude of the buffer 66 output. In this embodiment, the line regulation of the converter is somewhat degraded because of the absence of feedforward signal from the input supply.

Figure 7:
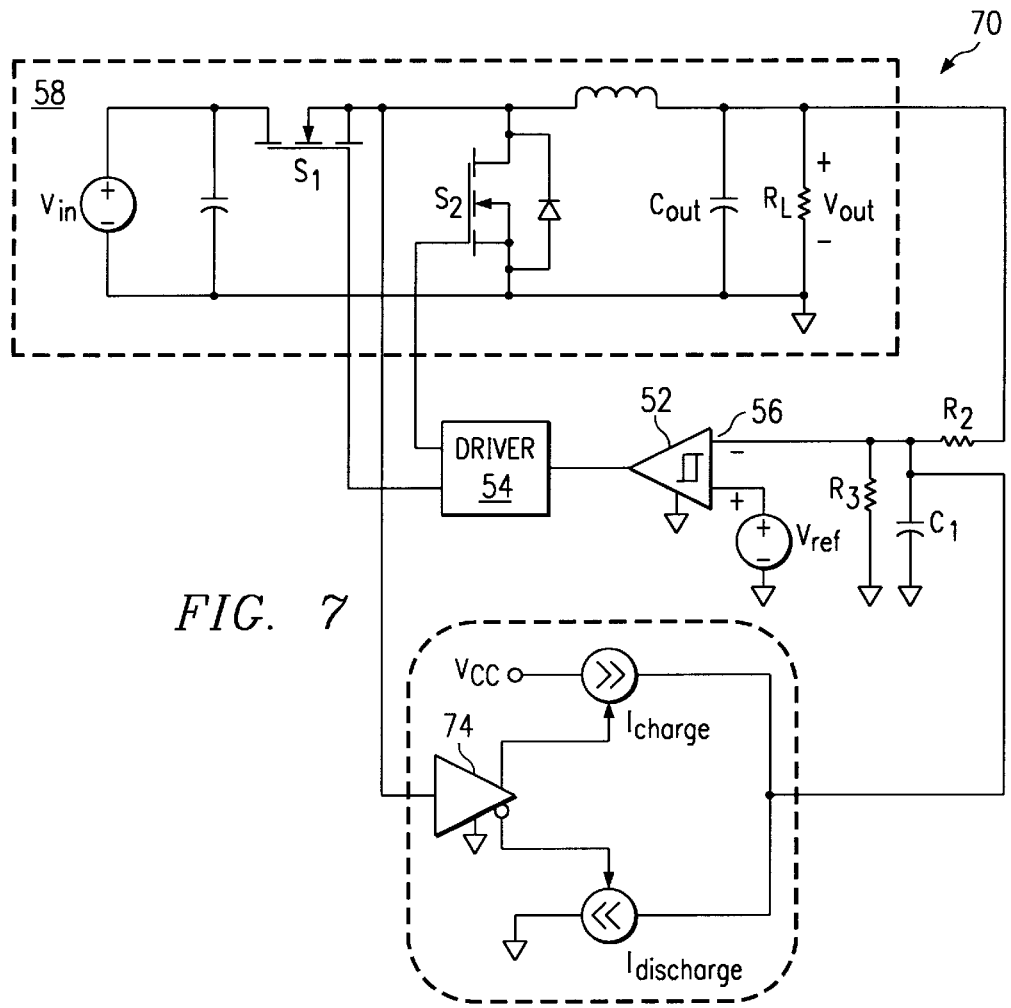
FIG. 7 shows a schematic diagram of a fourth embodiment of the present invention with hysteretic comparator 52 and circuit controls $I_{charge}$ and $I_{discharge}$ coupled to the first capacitor $C_1$, adapted to charge and discharge the first capacitor $C_1$.

A fourth embodiment 70 of the present invention is shown to include the DC to DC converter circuit 58 of FIG. 7 having a capacitor $C_1$ coupled between the input to hysteretic comparator 52 and ground. The control circuitry further includes current sources $I_{charge}$ and $I_{discharge}$ coupled to capacitor $C_1$ and an amplifier 74. Current source $I_{charge}$ is adapted to charge capacitor $C_1$ when the first power switch FET S1 of the DC to DC converter is on. At this time, current source $I_{discharge}$ is disconnected from $C_1$. Similarly, when the second power switch FET $S_2$ is on, the current source $I_{discharge}$ discharges the capacitor $C_1$, while the current source $I_{charge}$ is disconnected from $C_1$. The values of the current sources $I_{charge}$ and $I_{discharge}$ define the slope and rise/fall times of the ramp voltage at input 56 through capacitor $C_1$. By setting the $I_{charge}$ and $I_{discharge}$ currents to constant values, the operating frequency of the switches $S_1$ and $S_2$ of the DC to DC converter 58 remains independent of the input and output operating characteristics of the converter 58 including the output filter, but the output voltage $V_{out}$ line regulation is not reduced. Alternatively, current source $I_{charge}$ may be set proportional to $(V_{in} - V_{out})$ and current source $I_{discharge}$ may be set proportional to $V_{out}$, for example, resulting in the line regulation of the output voltage $V_{out}$ being improved. However, in this configuration, the operating frequency of the DC to DC converter 58 varies with the input voltage $V_{in}$.

Figure 8:
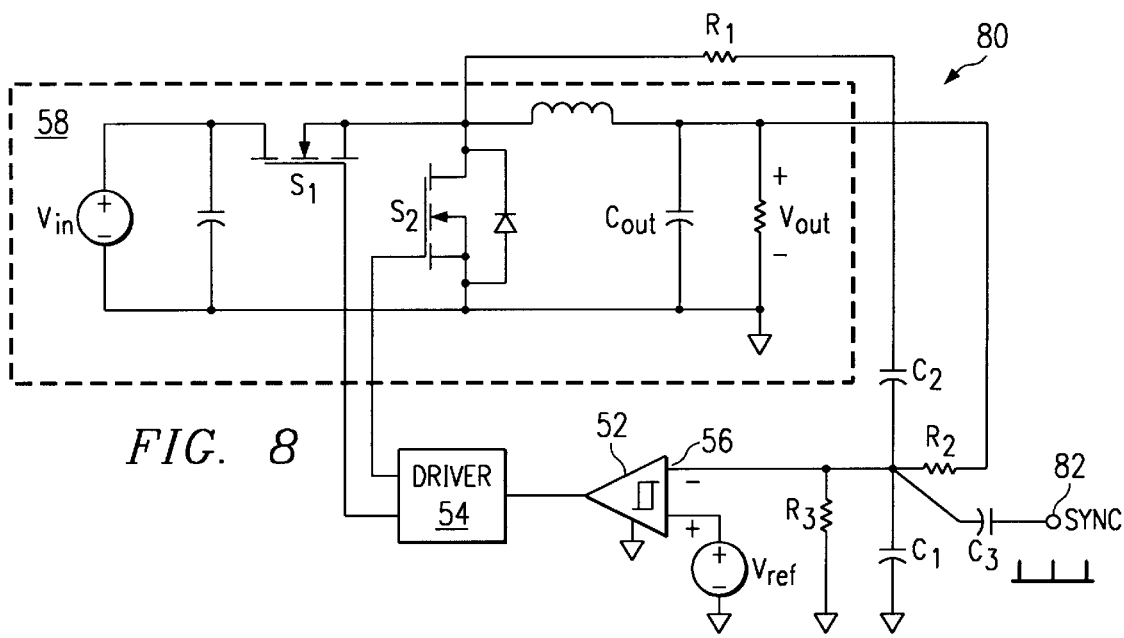
FIG. 8 illustrates a fifth embodiment having an external synchronization signal 82 coupled to the input of the hysteretic comparator 52 so that a plurality of DC to DC converters can be operated in parallel or interleaved.

A fifth embodiment of the present invention is generally shown at 80 in FIG. 8 and includes DC to DC converter circuit 58 similar to the second embodiment, with resistor $R_1$ and capacitors $C_1$ and $C_2$. In addition, an external synchronization signal 82 is also coupled to the input 56 of the hysteretic comparator 52. The switching frequency of converter 58 is independent from the output voltage $V_{out}$. This synchronization signal 82 is advantageous in some electronic systems where it may be important to synchronize the operating frequency of DC to DC converters to an external clock source for parallel operation, for interleaving several converters, or to avoid certain frequency ranges due to system issues, for example. Because the switching frequency of the improved hysteretic controller does not depend on the output filter characteristics, a plurality of different DC to DC converters can be synchronized with this configuration using synchronization signal 82.

The present invention is advantageous in providing an efficient hysteretic mode control circuit for a DC to DC converter having excellent load current transient response characteristics. Unlike prior art circuits, the switching frequency of the DC to DC converter is independent from the output filter characteristics. Furthermore, a lower tolerance range is achieved with the present invention, and the voltage output ripple is lower than in prior art circuits. A further advantage is decreased size and lowered cost of the output and input filters due to the use of high frequency, low value capacitors for components of the present circuit. The additional circuit components $C_1$, $R_1$, and $C_2$ disclosed herein may be implemented in monolithic integrated circuitry, thus decreasing the number of components, overall circuit size, and total costs. Also, the external synchronization of multiple DC to DC converters may be easily implemented in accordance with the fourth embodiment of the present invention. The frequency of the DC to DC converter may also be kept constant in accordance with the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the hysteretic mode control circuit for a DC to DC power converter of the present invention may be utilized with a power converter in a wide variety of applications, such as digital signal processors, microprocessors, telecommunications applications, mobile devices and systems, laptops and personal computers, mixed signal and analog devices, and any lower power electrical application, in general.

What is claimed is:

1. A DC to DC power converter, comprising:
   a first switch coupled to a second switch operating at a switching frequency, said converter adapted to receive an input voltage, generate an output voltage, and having an output filter coupled to said output voltage;
   a first circuit generating a ramp signal comprising a first capacitor generating said ramp signal at one end; and a hysteretic mode control circuit having an output coupled to said first and second switches and having an input coupled to said output filter and to said first circuit, said hysteretic mode control circuit controlling said switching frequency of said first and second switch as a function of said ramp signal.

2. The converter of claim 1 wherein said first capacitor is coupled to an input of said hysteretic mode control circuit, wherein said first circuit further comprises a first resistor coupled to a node defined between said first and second switches of said converter and said end of said first capacitor, wherein said switching frequency is dependent on the value of said first resistor and said first capacitor.

3. The circuit of claim 2 wherein said first circuit comprises a second capacitor coupled between said first resistor and said first capacitor.

4. The circuit of claim 3 wherein said second capacitor is at least 10 times the value of said first capacitor, wherein said output voltage is independent of the value of said first resistor.

5. The circuit of claim 1 wherein said first circuit further comprises a current charge source and a current discharge source, said current charge and discharge sources being coupled to an input of said hysteretic control circuit, wherein the values of said current charge and discharge sources define the slope of said ramp signal.

6. The circuit of claim 5 wherein said current charge and discharge sources are constant, wherein said switching frequency is independent from the input and output characteristics of said converter.

7. The circuit of claim 5 wherein said current charge source is proportional to the difference between said input voltage and said output voltage of said converter, wherein said discharge source is proportional to the output voltage, wherein the line regulation of the output voltage is improved, and wherein said switching frequency varies with the input voltage.

8. The circuit of claim 1 wherein said first circuit further comprises a synchronization signal coupled to an input of said hysteretic control circuit, wherein said switching frequency is independent from said output voltage.

9. The circuit of claim 1 wherein said output voltage of said converter has a ripple, wherein said ramp signal is greater than said ripple of said output voltage.

10. The circuit of claim 2 wherein said first circuit further comprises a buffer circuit coupled between said first resistor and said node, wherein said switching frequency is independent from said input voltage.

11. A DC to DC power converter, comprising:
a first switch coupled to a second switch operating at a switching frequency, said converter adapted to receive an input voltage, generate an output voltage, and having an output filter coupled to said output voltage, said output voltage having a ripple;
a first circuit generating a ramp signal being greater than said output voltage ripple, said first circuit comprising a first capacitor having a first end and a second end, said ramp signal generated at said first capacitor second end; and
a hysteretic mode control circuit having an output coupled to said first and second switches, and having an input coupled to said output filter and to said first circuit, the hysteretic mode control circuit controlling said switching frequency of said first and second switches as a function of said ramp signal such that said ripple of said output voltage is reduced.

12. The converter of claim 11 wherein said first capacitor second end is coupled to an input of said hysteretic mode control circuit, said first capacitor first end is coupled to ground, said first circuit further comprises a first resistor coupled to a node defined between said first and second switches of said converter and said second end of said first capacitor, and said switching frequency is dependent on the value of said first resistor and said first capacitor.

13. The converter of claim 12 further comprising a second capacitor coupled between said first resistor and said first capacitor, said second capacitor being at least 10 times the value of said first capacitor, wherein said output voltage of said converter is independent of the value of said first resistor.

14. The converter of claim 11 wherein said first circuit further comprises a current charge source and a current discharge source, said current charge and discharge sources being coupled to an input of said hysteretic control circuit, wherein the values of said current charge and discharge sources define the slope of said ramp signal.

15. The converter of claim 14 wherein said current charge and discharge sources are constant, where the switching frequency of said hysteretic control circuit is independent from said output voltage of said converter.

16. The converter of claim 14 wherein said current charge source is proportional to the difference between said input voltage and said output voltage of said converter, wherein said discharge sources is proportional to the output voltage, wherein the line regulation of the output voltage is improved, and wherein said switching frequency varies with the input voltage.

17. The converter of claim 11 wherein said first circuit further comprises a synchronization signal coupled to said input of said hysteretic control circuit, where said switching frequency is independent from said output voltage.

18. A method of controlling an output voltage of a DC to DC power converter, said converter including a first switch coupled to a second switch operating at a switching frequency, said converter adapted to receive an input voltage and generate an output voltage, said converter having a hysteretic mode control circuit, said hysteretic mode control circuit having an output coupled to said first and second switches and having an input coupled to said output filter, said method comprising the steps of:
generating a ramp signal using a first capacitor coupled to an input of said hysteretic mode control circuit; and
controlling said switching frequency using said ramp signal wherein said switching frequency is dependent on the value of said first capacitor.

19. The method of claim 18 further comprising the step of:
coupling a first resistor between said first capacitor and a node defined between said first and second switch, wherein said switching frequency is dependent on the value of said first resistor.

20. The method of claim 19 further comprising the step of:
coupling a second capacitor between said first resistor and said first capacitor, said second capacitor being larger than said first capacitor.

21. The method of claim 18 further comprising the step of:
selectively coupling a current charge source to said first capacitor, said current charge source adapted to charge said first capacitor; and
selectively coupling a current discharge source to said first capacitor, said current discharge source adapted to discharge said first capacitor.

22. The method of claim 18 further comprising the step of:
coupling a synchronization signal to said input of said hysteretic mode control circuit, wherein said DC to DC converter is adapted to be synchronized with at least one other DC to DC converter using said synchronization signal.

* * * * *